(12) United States Patent
Lim et al.

(10) Patent No.: US 8,963,138 B2
(45) Date of Patent: Feb. 24, 2015

(54) ORGANIC LIGHT EMITTING DISPLAY DEVICE AND MANUFACTURING METHOD THEREOF

(71) Applicant: Samsung Display Co., Ltd., Yongin-City, Gyeonggi-Do (KR)

(72) Inventors: Jae-Ik Lim, Yongin (KR); Min-Woo Kim, Yongin (KR); Hae-Yun Choi, Yongin (KR); Gee-Bum Kim, Yongin (KR)

(73) Assignee: Samsung Display Co., Ltd., Yongin (KR)

( * ) Notice: Subject to any disclaimer, the term of this patent is extended or adjusted under 35 U.S.C. 154(b) by 62 days.

(21) Appl. No.: 13/739,964

(22) Filed: Jan. 11, 2013

(65) Prior Publication Data

US 2014/0027724 A1   Jan. 30, 2014

(30) Foreign Application Priority Data

Jul. 25, 2012   (KR) .................. 10-2012-0081344

(51) Int. Cl.
| | |
|---|---|
| *H01L 29/08* | (2006.01) |
| *H01L 35/24* | (2006.01) |
| *H01L 51/00* | (2006.01) |
| *H01L 51/52* | (2006.01) |
| *H01L 27/32* | (2006.01) |

(52) U.S. Cl.
CPC ............ *H01L 51/5281* (2013.01); *H01L 51/52* (2013.01); *H01L 51/5275* (2013.01); *H01L 27/322* (2013.01)
USPC .............. 257/40; 257/E33.001; 257/E27.111; 438/29; 313/506

(58) Field of Classification Search
CPC ............ H01L 27/3244; H01L 51/5284; H01L 2251/5315; H01L 2251/5323; H01L 51/5228; H01L 27/322; H01L 27/3272; H01L 51/56; H01L 27/3232; H01L 27/3276; H01L 27/3246; H01L 51/5281; H01L 2251/5346
See application file for complete search history.

(56) References Cited

U.S. PATENT DOCUMENTS

| | | | |
|---|---|---|---|
| 7,990,058 B2 | 8/2011 | Cok et al. | |
| 2006/0060870 A1* | 3/2006 | Park et al. | ........... 257/88 |
| 2010/0053535 A1 | 3/2010 | Kim et al. | |
| 2012/0074397 A1 | 3/2012 | Okumoto | |
| 2012/0286305 A1 | 11/2012 | Sasaki et al. | |

FOREIGN PATENT DOCUMENTS

| | | |
|---|---|---|
| KR | 10-2007-0049223 A | 5/2007 |
| KR | 10-2008-0041435 A | 5/2008 |
| KR | 10-2009-0065104 A | 6/2009 |
| KR | 10-2009-0126597 A | 12/2009 |
| KR | 10-2010-0073228 A | 7/2010 |
| KR | 10-2011-0082023 A | 7/2011 |

* cited by examiner

*Primary Examiner* — Sonya D McCall Shepard
(74) *Attorney, Agent, or Firm* — Knobbe, Martens, Olson & Bear, LLP

(57) ABSTRACT

An organic light emitting display device including: a substrate; a plurality of first electrodes formed over the substrate; a pixel defining layer (PDL) formed over the substrate, and separating the plurality of first electrodes from one another when viewed in a thickness direction of the display device; a plurality of light emitting layer portions, each of which is formed over one of the plurality of first electrodes; at least a second electrode formed over the plurality of light emitting layer portions; and a filter unit formed over the at least a second electrode. The filter unit includes a black matrix layer having an opening and a plurality of color filters formed over the black matrix layer, and each color filter comprising at least one embossed portion formed over one of the plurality of openings.

19 Claims, 13 Drawing Sheets

ORGANIC LIGHT EMITTING DISPLAY DEVICE AND MANUFACTURING METHOD THEREOF

CROSS-REFERENCE TO RELATED APPLICATIONS

This application is based on and claims priority from Korean Patent Application No. 10-2012-0081344, filed on Jul. 25, 2012, with the Korean Intellectual Property Office, the present disclosure of which is incorporated herein in its entirety by reference.

TECHNICAL FIELD

The present disclosure relates to an organic light emitting display device and a method of making the same.

BACKGROUND

An organic light emitting display device is in the limelight as a next-generation display because of merits such as low voltage driving, a light and thin film type, a wide viewing angle, and a rapid response speed. In particular, recently, researches on a flexible display apparatus using an organic light emitting device have been actively in progress.

When the organic light emitting display device is viewed under an environment in which external light such as sunlight exists, there is a problem in that visibility is deteriorated due to light reflected onto the display apparatus.

SUMMARY

One aspect provides an organic light emitting display device capable of preventing visibility from being deteriorated due to external light and improving a viewing angle characteristic.

An embodiment provides an organic light emitting display device, including: a substrate; a plurality of first electrodes formed over the substrate; a pixel defining layer (PDL) formed over the substrate, and separating the plurality of first electrodes from one another when viewed in a thickness direction of the display device; a plurality of light emitting layer portions, each of which is formed over one of the plurality of first electrodes; at least a second electrode formed over the plurality of light emitting layer portions; and a filter unit formed over the at least a second electrode, in which the filter unit includes a black matrix layer defining a plurality of openings and a plurality of color filters formed over the black matrix layer, and each color filter comprising at least one embossed portion formed over one of the plurality of openings.

An organic layer may be formed over the color filters.

The plurality of light emitting layer portions may include a red light emitting layer portion, a green light emitting layer portion, and a blue emitting layer portion, and the plurality of color filters may include a red filter, a green filter, and a blue filter which correspond to the red light emitting layer portion, the green light emitting layer portion, the blue light emitting layer portion, respectively.

Each of light emitting layer portions may include a white light emitting material, and the plurality of color filters may include a red filter, a green filter and a blue filter, each of which is disposed over the white light emitting material of one of the light emitting layer portions.

The black matrix may be formed to overlap the pixel defining layer when viewed in the thickness direction.

The black matrix may be made of a material having a light absorptive property.

The embossed portion may be formed in a convex lens shape.

The embossed portion may be formed in a concave lens shape.

The plurality of first electrodes, the plurality of light emitting layer portions and the at least a second electrode may be configured to form a plurality of pixels which are separated from one another by the pixel defining layer when viewed in the thickness direction, the plurality of embossed portions are formed at an area corresponding to the plurality of pixels.

One embossed portion may be formed for each of the plurality of the plurality of pixels.

Two or more embossed portions may be formed for each of the plurality of pixels.

The organic layer may be formed of a material having a refractive index of about 1.2 to about 1.5.

The organic layer may be formed of a material having a refractive index of about 1.5 to about 1.8.

An angle between the embossed portion and a surface parallel to the substrate may be in the range of about 15 degrees to about 70 degrees.

A plurality of thin film transistor layers and an insulation layer formed over the plurality of thin film transistor layers may be formed over the substrate.

A protective layer may be formed between the second electrode and the filter unit.

At least one of a hole injection layer and a hole transfer layer may be included between the first electrode and one of the light emitting layer portions.

At least one of an electron injection layer and an electron transport layer may be disposed between one of the light emitting layer portions and the second electrode.

Another embodiment provides a manufacturing method of an organic light emitting display device, including: forming a black matrix having an opening over a thin film encapsulation; forming an color filter layer over the black matrix; exposing the color filter layer to light; developing the color filter layer; and forming an organic layer over the color filter layer and flattening the organic layer.

In the exposing, the organic light emitting display device may be manufactured by using a mask.

According to the embodiments, it is possible to improve visibility of external light and a viewing angle characteristic in the organic light emitting display device. Further, it is possible to simplify a manufacturing process in the organic light emitting display device.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
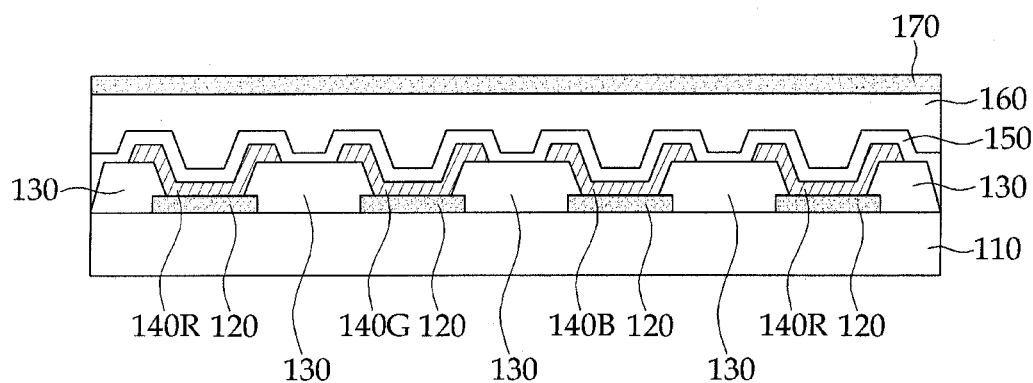
FIG. 1 is a diagram illustrating an organic light emitting display device onto which a polarizer or polaroid film is attached.

Hereinafter, embodiments will be described in more detail with reference to the accompanying drawings. The scope of the present invention is not limited to embodiments to be described below and the accompanying drawings. Embodiments to be described below and illustrated in the drawings may be modified and utilized in various different ways.

For reference, respective components and shapes thereof are schematically drawn or exaggeratedly drawn in the accompanying drawings for easy understanding. Like reference numerals designate like elements throughout the drawings.

Further, it will be understood that when a layer or an element is described as being "on" another layer or element, it may be directly disposed on another layer or element, or an intervening layer or element may also be present.

As an example for solving the problem regarding the visibility, as illustrated in FIG. 1, a method of attaching a polarizer or a polaroid film onto an encapsulation layer of the organic light emitting display device may be applied.

The organic light emitting display device illustrated in FIG. 1 includes a substrate 110, a first electrode 120 disposed on the substrate 110, a pixel defining layer 130 for sectioning the first electrode 120, light emitting layers 140R, 140G, and 140B formed on the first electrode 120, a second electrode 150 formed on the light emitting layer 140, and a protective layer 160 formed on the second electrode 150, and a polarizer or polaroid film which is polarized in one direction in order to prevent reflection of external light is disposed on the protective layer 160.

As illustrated in FIG. 1, by attaching the polarizer or polaroid film to the organic light emitting display device, it is possible to prevent reflection due to external light. However, there may still be a problem in that extraction efficiency of light generated from the light emitting layer is reduced due to the polarizer or polaroid film.

Figure 2:
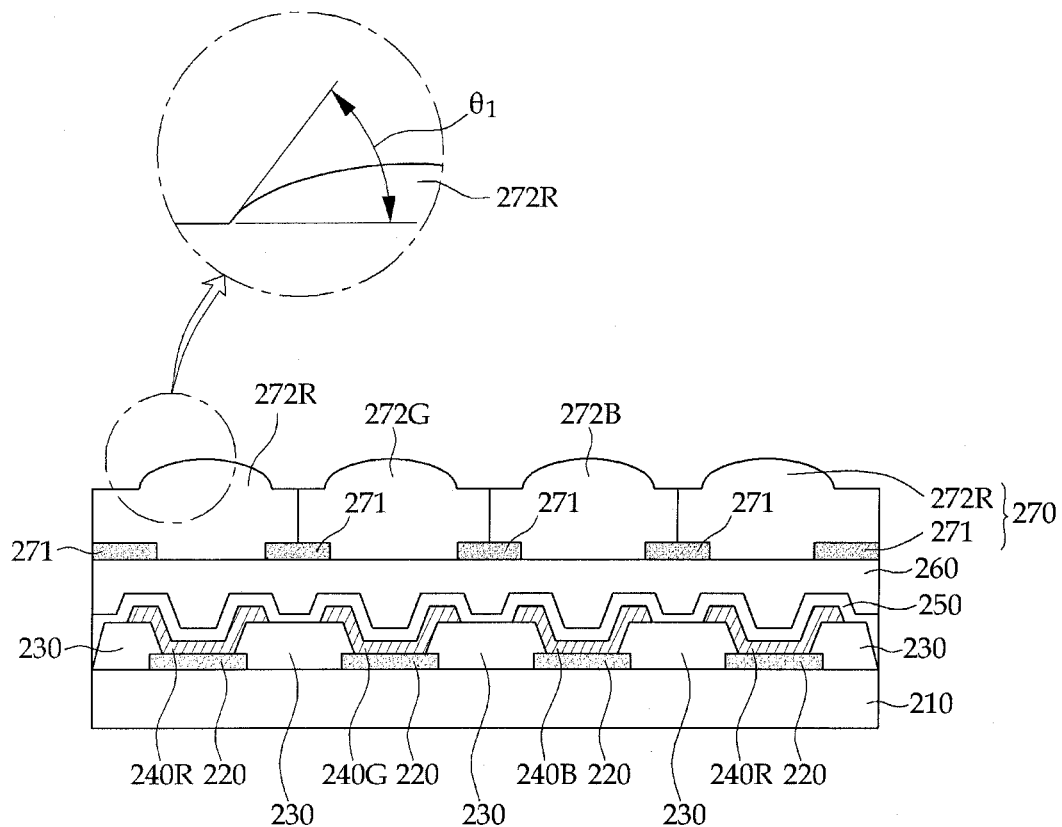
FIG. 2 is a diagram illustrating an organic light emitting display device according to an embodiment.

FIG. 2 is a diagram illustrating an organic light emitting display device according to an embodiment.

The organic light emitting display device of FIG. 2 includes a substrate 210, a plurality of first electrodes 220 formed on the substrate 210, a pixel defining layer 230 formed on the substrate and separating the plurality of first electrodes 220 from one another when viewed in a thickness direction of the display device, a plurality of light emitting layers 240R, 240G, and 240B formed above the first electrodes 220, a second electrode 250 formed above the light emitting layer 240, a protective layer 260 formed on the second electrode 250, and a filter unit 270 formed above the protective layer 260. Here, the filter unit 270 includes a black matrix 271 formed at a position overlapping with the pixel defining layer 230 when viewed in the thickness direction, and color filters 272R, 272G, and 272B formed on the protective layer 260 where the black matrix 271 is patterned.

Figure 3:
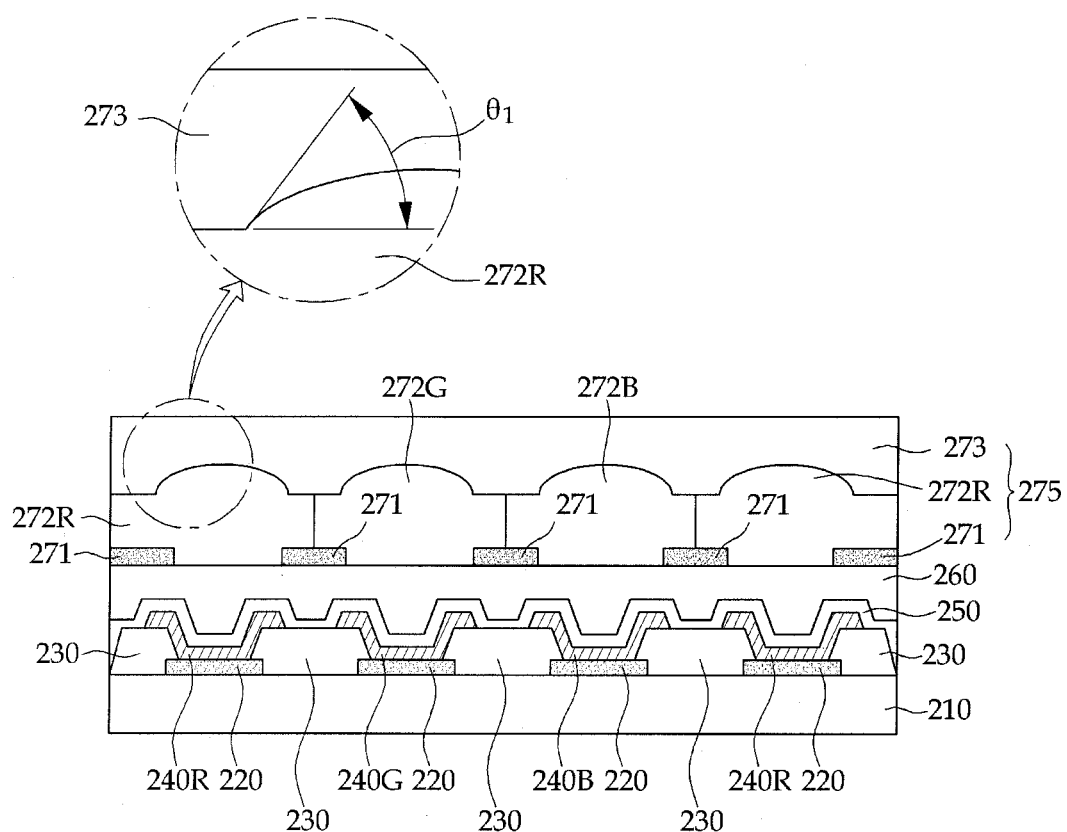
FIG. 3 is a diagram illustrating an organic light emitting display device according to another embodiment.

The organic light emitting display device of FIG. 3 may include a black matrix 271, color filters 272R, 272G, and 272B, and an organic layer 273 in a filter unit 275 formed above the protective layer 260.

The substrate 210 may be made of various materials such as glass, metal, and plastic and may be formed by using a flexible material. In the case of a rear light emission in which an image is implemented in a substrate direction, the substrate 210 needs to be made of a light transmitting material, but in the case of a front light emission, the substrate 210 is not necessarily required to be made of the light transmitting material. Hereinafter, for uniformly describing, a front light emission type organic light emitting display device will be described as an example.

The first electrode 220 may be formed on the substrate 210. The first electrode 220 may include a reflective layer which is made of gold (Au), platinum (Pt), nickel (Ni), tungsten (W), chromium (Cr), molybdenum (Mo), iron (Fe), cobalt (Co), copper (Cu), palladium (Pd), titanium (Ti), and compounds thereof. In addition to the reflective layer, the first electrode 220 may further include a transparent layer which is made of indium tin oxide (ITO) and indium zinc oxide (IZO), which have a high work function. In addition, the first electrode 220 may be made of various materials which are known in the art. Further, the first electrode 220 may act as an anode electrode.

Although not illustrated in FIG. 2, a thin film transistor and an insulation layer protecting the thin film transistor may be further included between the substrate 210 and the first electrode 220. In this case, at least one thin film transistor is formed for each pixel and may be electrically connected with the first electrode 220.

In embodiments, the pixel defining layer (PDL) 230 may be formed over the substrate and may separate the first electrodes 220 from one another when viewed in a thickness direction of the display device to form a plurality of pixels. The pixel defining layer 230 can serve as an insulation layer to electrically block the plurality of first electrodes 220. In embodiments, the pixel defining layer (PDL) 230 may overlap with a periphery of the first electrodes 220.

In embodiments, the pixel defining layer 230 of each pixel covers only a peripheral part of the upper surface of the first electrode 220, and the rest of the part of the first electrode 220 is not covered by the pixel defining layer 230 and may be exposed through an opening of the pixel defining layer 230. The light emitting layer 240 of each pixel to be described below may be formed in a region defined by the opening. In embodiments, a portion of the light emitting layer 240 is formed on or over the first electrode through the opening, and another portion of the light emitting layer 240 may be formed on or over the pixel defining layer 230 as illustrated in FIG. 2.

The organic light emitting display device according to FIG. 2 is exemplified as the front light emission type, and the second electrode 250 may be provided as a transmissive electrode. For example, the second electrode may be formed by a thin transflective layer which is made of metal having a low work function, that is, alkali metal such as lithium (Li) and cesium (Cs), alkaline earth metal such as magnesium (Mg), calcium (Ca) and strontium (Sr), and compounds thereof. A transparent conductive layer made of indium tin oxide (ITO)

and indium zinc oxide (IZO) may be further included above or below the metal transflective layer. The second electrode 250 may act as a cathode electrode.

The light emitting layer 240 may be provided between the first electrode 220 and the second electrode 250. Although not illustrated in FIG. 2, a hole transfer layer (HTL) and a hole injection layer (HIL) may be formed between the first electrode 220 and the light emitting layer 240. Further, an electron transport layer (ETL) and an electron injection layer (EIL) may be formed between the light emitting layer 240 and the second electrode 250.

In embodiments, the plurality of light emitting layers 240 may include a red light emitting layer 240R, a green light emitting layer 240G, and a blue light emitting layer 240B.

In embodiments, the each light emitting layer 240 may include a white light emitting layer, and one of a red color filter, a green color filter, and a blue color filter which may be formed on or over the white light emitting layer such that red light, green light and blue light are emitted through the red color filter, the green color filter, and the blue color filter.

The protective layer 260 for protecting the light emitting layer 240 from an external environment such as moisture or oxygen may be provided on the second electrode 250.

The protective layer 260 may be formed of a thin film encapsulation layer in which a plurality of organic layers and inorganic layers cross each other and are laminated or a transparent substrate such as encap glass.

In the case where the protective layer 260 is the thin film encapsulation layer, the protective layer 260 may include a plurality of organic layers and a plurality of inorganic layers which are alternately laminated. The organic layers may be formed by containing acrylate-based materials, and the inorganic layers may be formed by containing oxide-based materials.

A black matrix 271 may be formed on or over the protective layer 260 and overlap the pixel defining layer 230 when viewed in the thickness direction.

The black matrix 271 is formed by using opaque metal such as chromium (Cr) or chromium oxide (CrOx) or a black resin-based material which absorbs light.

The black matrix 271 may absorb light exposed onto the organic layer during a manufacturing process of the organic light emitting display device. Accordingly, there is a difference in an exposure amount between a region with the black matrix 271 and a region without the black matrix 271. That is, the black matrix may serve to control the light exposure amount for each region during an exposure process.

Further, the black matrix 271 is formed in a non-pixel area of the organic light emitting display device to block light leakage on a boundary of a pixel or pixel area, thereby improving contrast.

In embodiments, the black matrix 271 may be formed by a photolithography method of coating opaque metal such as chromium (Cr) or chromium oxide (CrOx) or a black resin-based material which absorbs light on the entire surface of the protective layer 260 and then performing patterning through a mask process.

In alternative embodiments, the black matrix 271 may be formed by a vacuum deposition method using a micro transfer molding method. In addition, the black matrix 271 may be formed by various processing methods which are known in the art.

Color filters 272R, 272G, and 272B are formed on or over the black matrix 271 and formed on or over the protective layer exposed through openings of the black matrix 271.

The color filters 272R, 272G, and 272B may be formed by a process such as a pigment dispersion method, a dyeing method, an electrodeposition method, or a thermal transfer method. In addition, the color filters may be formed by using a method of forming a color filter which is known in the art.

In embodiments, the color filters 272R, 272G, and 272B may have a convex lens-shaped, embossed portions raised or protruding in a light emitting direction. An angle ($\theta_i$) between the embossed portion and a surface parallel to the substrate may be in the range of about 10 degrees to about 70 degrees. Further, in an embodiment, a single embossed portion may be formed for each pixel, and in an alternative embodiment, two or more embossed portion may be formed for each pixel. In embodiments, a color filter 272R, 272G or 272B having convex embossed portion can function as a micro convex lens.

A method of forming the convex lens-shaped embossed portion on the color filters 272R, 272G, and 272B is performed by using a photolithography process.

The color filters 272R, 272G, and 272B are uniformly coated on positions corresponding to the light emitting layers 240R, 240G, and 240B on or over the protective layer 260 where the black matrix 271 is patterned.

A mask is formed at a position corresponding to the position where the black matrix 271 is patterned, when viewed in the thickness direction, and the mask is exposed by using an exposure apparatus such as a stepper.

As such, the convex lens-shaped embossed portions may be formed in the color filters 272R, 272G, and 272B through a developing process after the exposing process using the mask.

The organic light emitting display device of FIG. 3 may further include an organic layer 273 of the organic light emitting display device of FIG. 2.

The organic layer 273 may be made of a material having a refractive index smaller than a refractive index of the color filters 272R, 272G, and 272B of about 1.5. Preferably, the organic layer 273 may be formed by using a material having a refractive index of about 1.2 to about 1.5. Further, the organic layer 273 may be made of a transparent material.

Figure 4A:
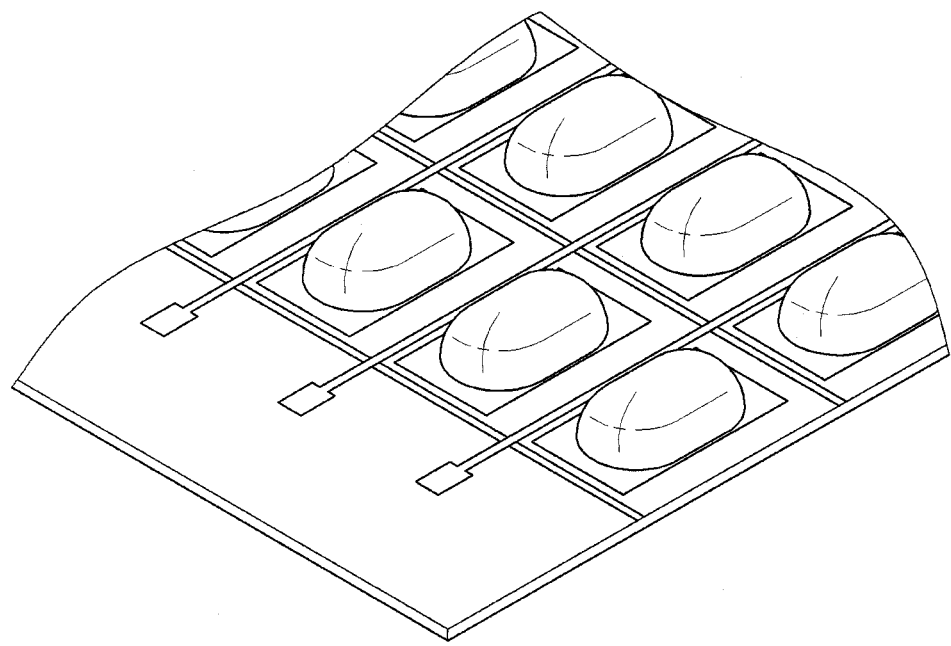
FIG. 4A is an example of an embossed portion shape formed on a color filter layer according to the embodiment of FIG. 2.

FIG. 4A is an example of embossed portions formed in the color filters 272R, 272G, and 272B according to the embodiment of FIG. 2. As illustrated in FIG. 4A, one embossed portion may be formed in each of the color filters 272R, 272G, and 272B for each pixel.

Figure 4B:
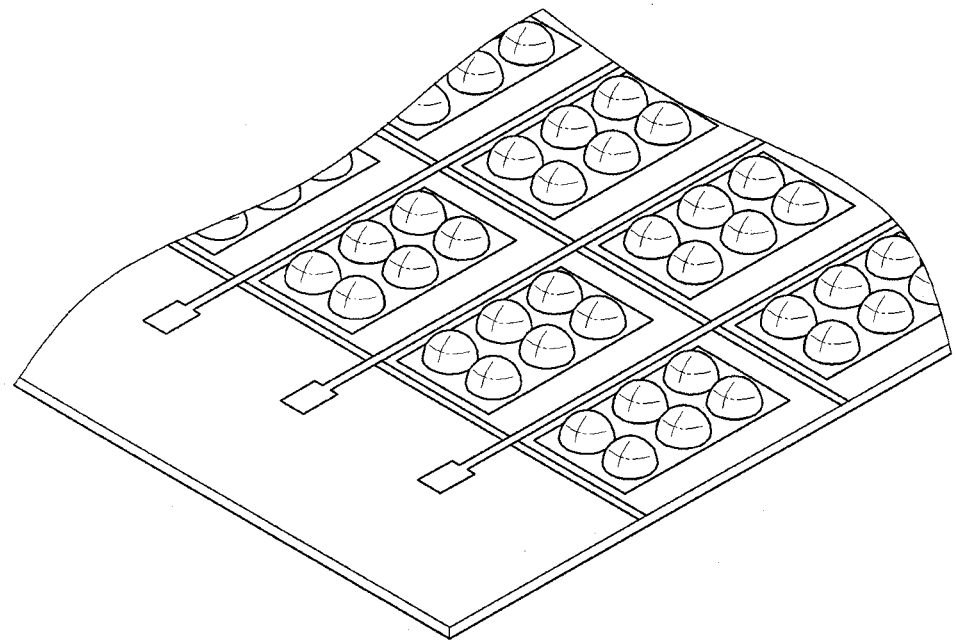
FIG. 4B is another example of an embossed portion shape formed on a color filter layer according to the embodiment of FIG. 2.

FIG. 4B is another example of embossed portions formed in the color filters 272R, 272G, and 272B according to the embodiment of FIG. 2. As illustrated in FIG. 4B, two or more embossed portions may be formed in each of the color filters 272R, 272G, and 272B for each pixel.

FIGS. 5A to 5I are diagrams for describing a manufacturing method of the organic light emitting display device according to the embodiment.

The organic light emitting display device according to the embodiment is manufactured by forming a plurality of first electrodes 220 on the substrate 210 (see FIG. 5A), forming a pixel defining layer 230 among the plurality of first electrodes 220 (see FIG. 5B), forming light emitting layers 240R, 240G, and 240B on the first electrode 220 (see FIG. 5C), forming a second electrode 250 on the light emitting layer 240 (see FIG. 5D), forming a protective layer 260 on the second electrode 250 (see FIG. 5E), forming a black matrix pattern 271 on the protective layer 260 (see FIG. 5F), forming color filters 272R, 272G, and 272B on or over the protective layer 260 where the black matrix 271 is patterned (see FIG. 5G), and forming convex lens-shaped embossed portions by exposing and then developing the color filters 272R, 272G, and 272B by using a mask. (see FIGS. 5H and 5I)

Further, an organic layer 273 may be further formed on the color filters 272R, 272G, and 272B, and in this case, the manufactured organic light emitting display device is the same as the organic light emitting display device illustrated in FIG. 3.

<Light Extraction Efficiency>

A light extraction simulation model for verifying improvement of the light extraction efficiency of the organic light emitting display device according to the embodiment may be set as follows.

For comparison, an organic light emitting display device including a flat color filter may be set as Comparative Example. Here, a refractive index of the color filter is 1.5, and a general color filter is used.

The organic light emitting display device according to the embodiment may include the color filters with a convex lens-shaped embossed portion formed in a light emitting direction (see FIG. 3). An angle between the embossed portion and the substrate is 60 degrees, and a refractive index of the color filters with the embossed portion is 1.5. The organic layer is formed on the convex lens-shaped color filters, and a refractive index of the organic layer is 1.2.

Figure 6A:
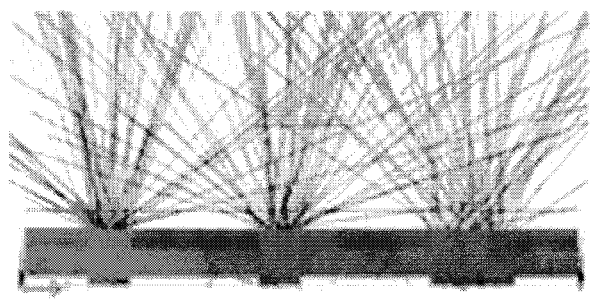
FIGS. 6A to 6B are examples of comparing light emitting efficiencies in Example of the present embodiment and Comparative Example.
Figure 6B:
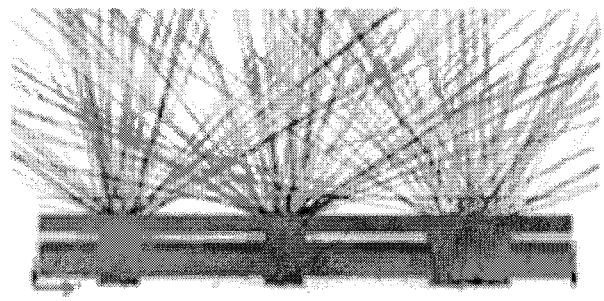

FIGS. 6A to 6B are simulation diagrams illustrating amounts of light which are emitted from the organic light emitting display device of Comparative Example and the organic light emitting display device according to Example of the present embodiment to the front sides thereof.

In the case where the color filter layer with the convex lens-shaped embossed portion formed in a light emitting direction is included like the Example of the present embodiment, the amount of light emitted to the front side may be increased to about 115% as compared with the case where the embossed portion is not formed like the Comparative Example.

<Improvement of Viewing Angle>

Figure 7:
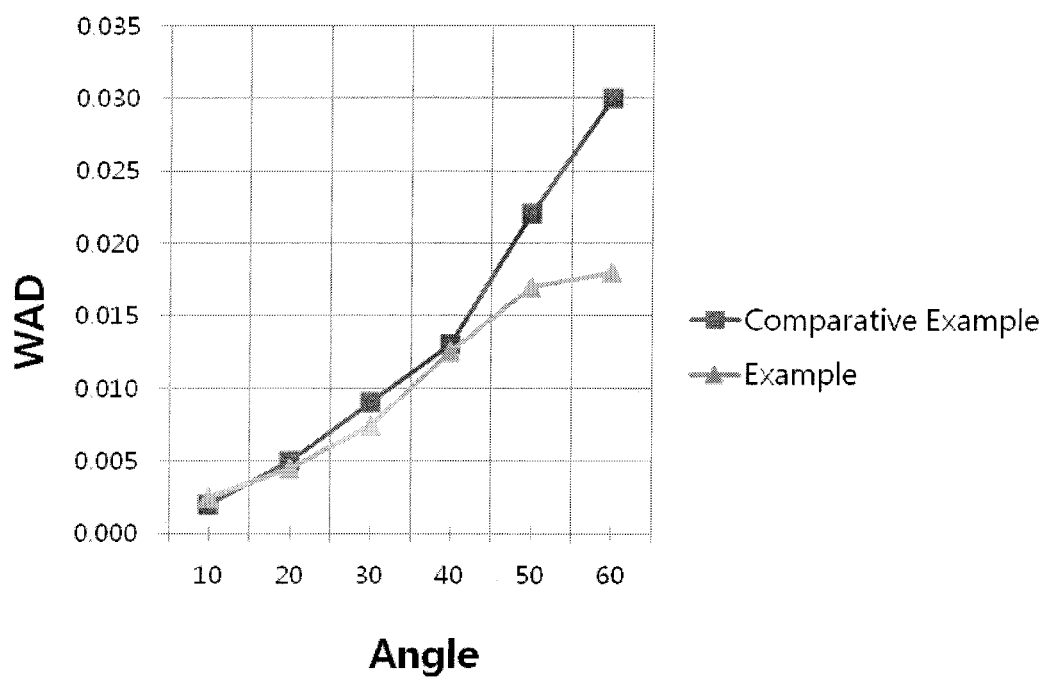
FIG. 7 is an example of comparing viewing angle characteristics of the organic light emitting display devices in Example of the present embodiment and Comparative Example.

FIG. 7 is an example of comparing viewing angle characteristics of organic light emitting display devices according to Example of the present embodiment and Comparative Example.

In a graph illustrated in FIG. 7, an x-axial direction represents an angle, and a y-axial direction represents a change of luminance. That is, after the luminance is measured in the range of 0 to 60 degrees based on a virtual line which is vertical to the light emitting surface, the graph illustrates a change of a luminance ratio at each angle to the luminance when the angle is 0 degree. Accordingly, as the change according to an angle change becomes smaller, the viewing angle characteristic may be excellent.

In FIG. 7, a WAD value of the Comparative Example is 0.03 at an angle of 60 degrees, and a WAD value of the Example of the present embodiment is 0.018 at an angle of 60 degrees. That is, it is verified that the viewing angle characteristic of the organic light emitting display device including the color filter layer with the embossed portion like the Example is improved more than the viewing angle characteristic of the structure without the embossed portion.

Figure 8:
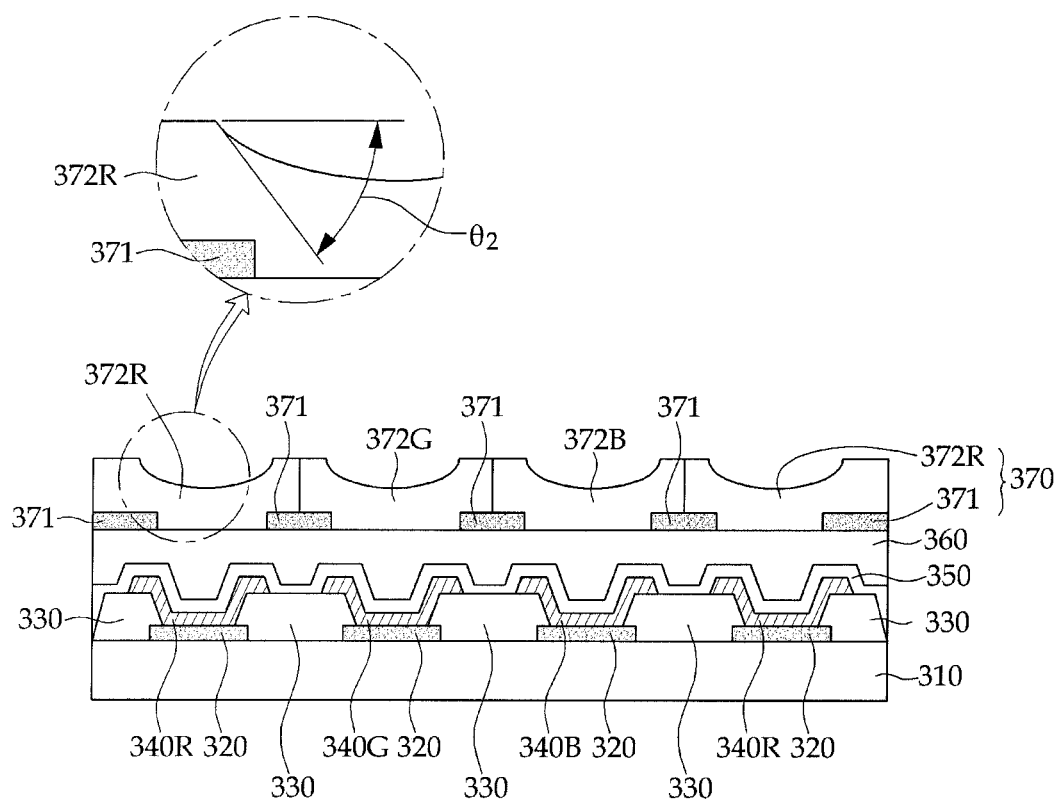
FIG. 8 is a diagram illustrating an organic light emitting display device according to another embodiment.

FIG. 8 is a diagram illustrating an organic light emitting display device according to another embodiment.

In embodiments, the organic light emitting display device of FIG. 8 includes a substrate 310, a plurality of first electrodes 320 formed on the substrate 310, a pixel defining layer 330 formed on or over the substrate and separating the plurality of first electrodes 320 from one another when viewed in a thickness direction of the display device, a plurality of light emitting layers 340R, 340G, and 340B formed above the first electrodes 320, a second electrode 350 formed above the light emitting layer 340, a protective layer 360 formed on the second electrode 350, and a filter unit 370 formed above the protective layer 360. Here, the filter unit 370 includes a black matrix 371 formed at a position overlapping the pixel defining layer 330 when viewed in the thickness direction, and color filters 372R, 372G, and 372B formed on or over the protective layer 360 where the black matrix 371 is patterned.

Figure 9:
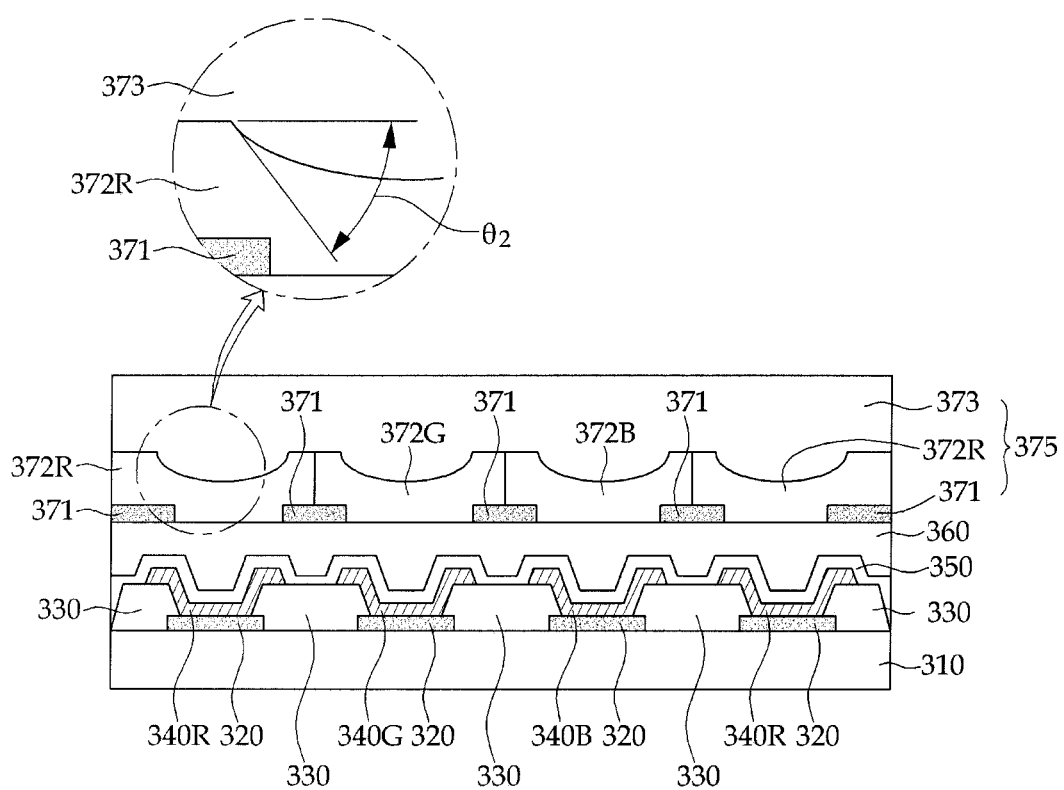
FIG. 9 is a diagram illustrating an organic light emitting display device according to another embodiment.

The organic light emitting display device of FIG. 9 may include a black matrix 371, color filters 372R, 372G, and 372B, and an organic layer 373 in a filter unit 375 formed above the protective layer 360.

Among constituent elements of the organic light emitting display devices of FIGS. 8 and 9, duplicated description for the same constituent element as the organic light emitting display devices illustrated in FIGS. 2 and 3 is omitted.

Color filters 372R, 372G, and 372B are formed on the black matrix 371 and the protective layer exposed through openings of the black matrix 371.

The color filter 372 may be formed by a process such as a pigment dispersion method, a dyeing method, an electrodeposition method, or a thermal transfer method. In addition, the color filters may be formed by using methods of forming a color filter which are known in the art.

The color filters 372R, 372G, and 372B may have a concave lens-shaped embossed portion sunken in a direction opposite to the light emitting direction. An angle ($\theta_2$) between the embossed portion and a surface parallel to the substrate may be in the range of about 10 degrees to about 70 degrees. Further, one embossed portion may be formed for each pixel, and two or more embossed portion may be formed for each pixel. In embodiments, the color filter having an embossed portion can function as a micro concave lens.

A method of forming the concave lens-shaped embossed portion on the color filters 372R, 372G, and 372B is performed by using a photolithography process.

The color filters 372R, 372G, and 372B corresponding to the light emitting layers 340R, 340G, and 340B are uniformly formed on or over the protective layer 360 where the black matrix 371 is patterned.

A mask is formed to cover positions corresponding to the positions where the light emitting layers 340R, 340G, and 340B are formed, when viewed in the thickness direction and exposed by using an exposure apparatus such as a stepper.

As such, the concave lens-shaped embossed portion may be formed on the color filters 372R, 372G, and 372B through a developing process after the exposing process using the mask.

The organic light emitting display device of FIG. 9 may further include an organic layer 373 on the organic light emitting display device of FIG. 8.

The organic layer 373 may be made of a material having a refractive index larger than a refractive index of the color filters 372R, 372G, and 372B of about 1.5. Preferably, the organic layer 373 may be formed by using a material having a refractive index of about 1.5 to about 1.8. Further, the organic layer 373 may be made of a transparent material.

Figure 10A:
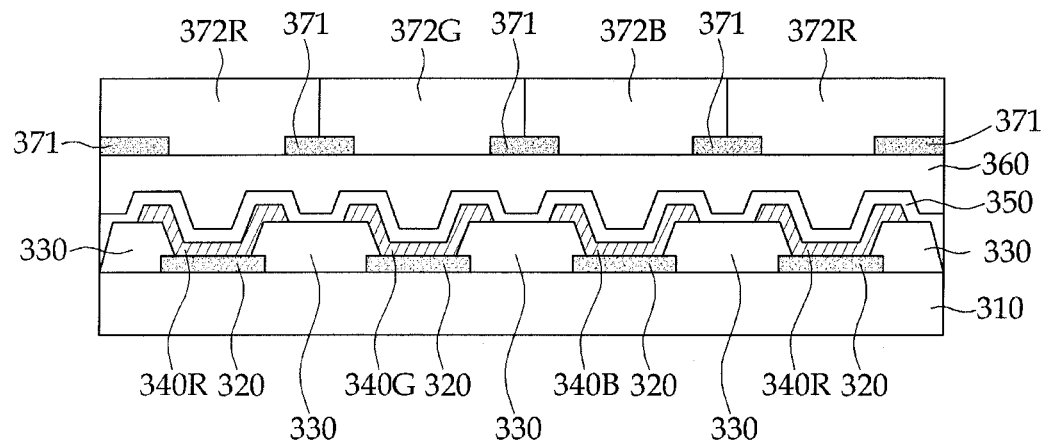
FIGS. 10A to 10C are diagrams for describing a manufacturing method of the organic light emitting display device according to another embodiment.
Figure 10B:
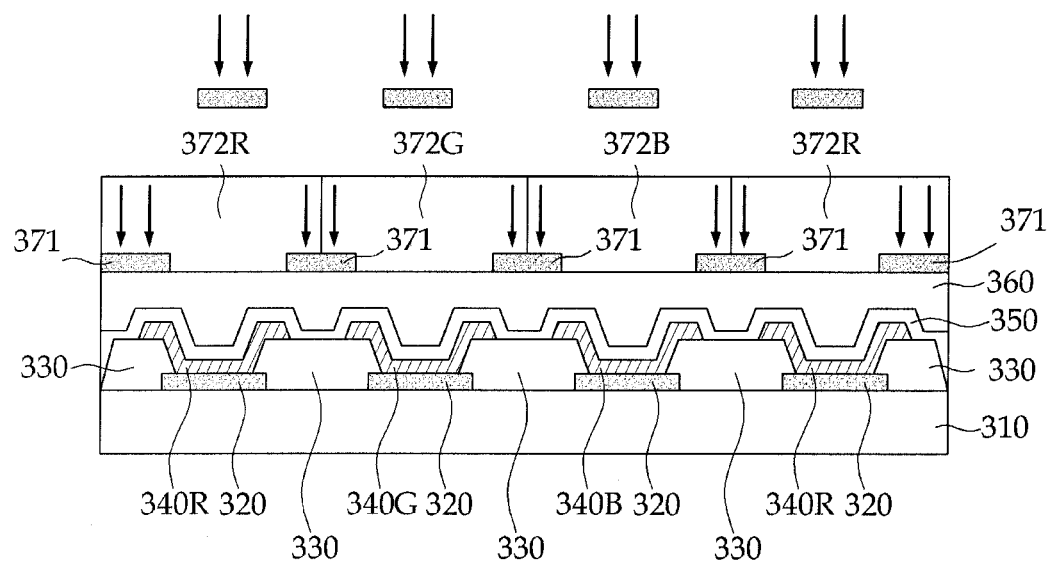
Figure 10C:
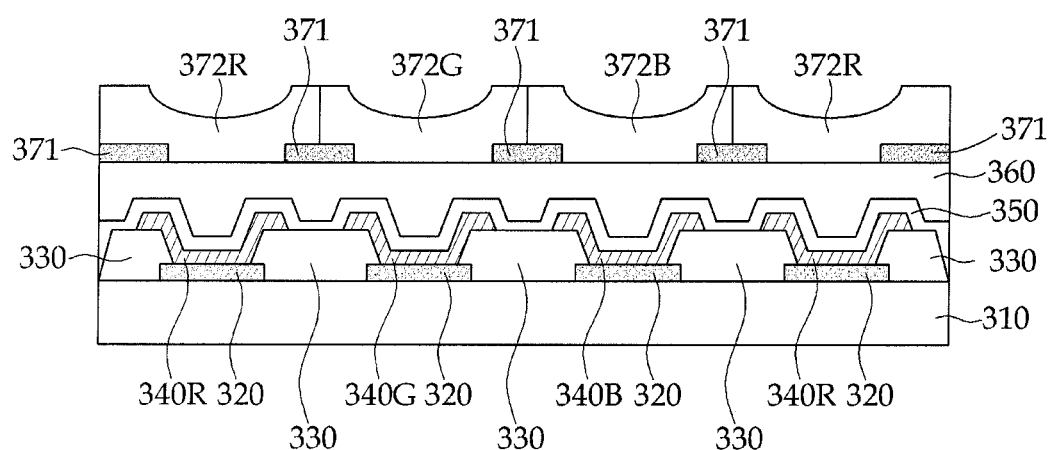

FIGS. 10A to 10C are diagrams for describing a manufacturing method of the organic light emitting display device according to another embodiment.

Figure 5A:
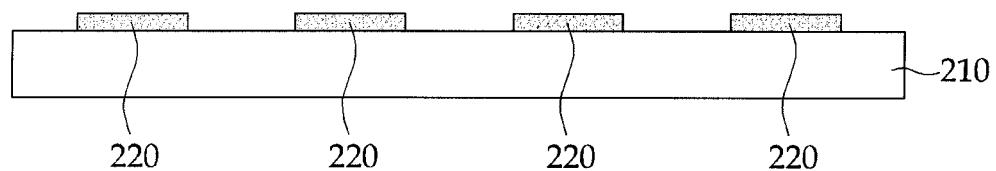
FIGS. 5A to 5I are diagrams for describing a manufacturing method of the organic light emitting display device according to the embodiment.
Figure 5B:
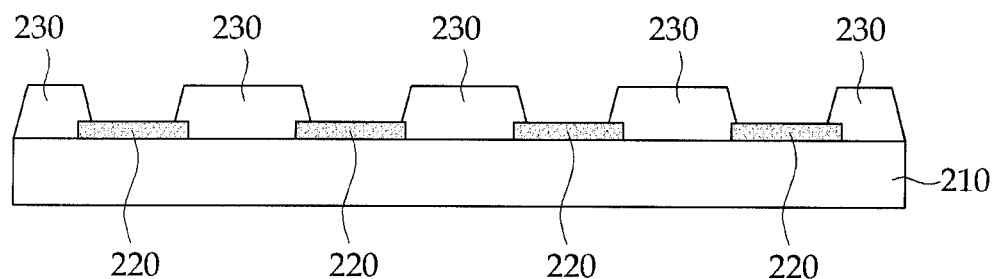
Figure 5C:
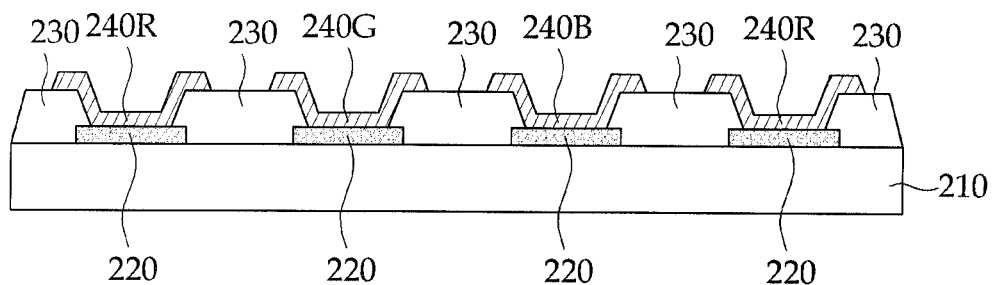
Figure 5D:
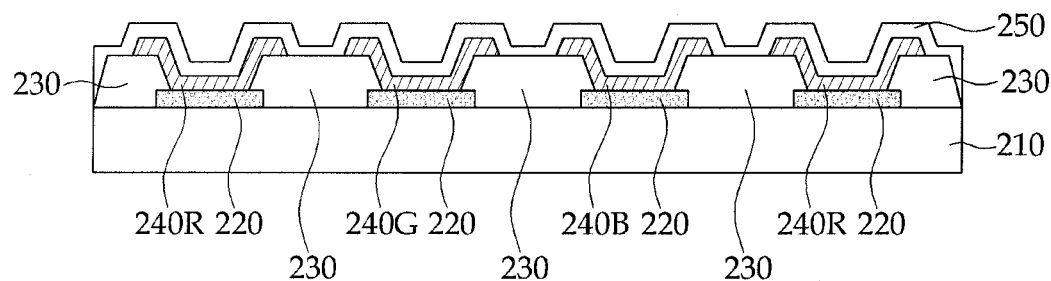
Figure 5E:
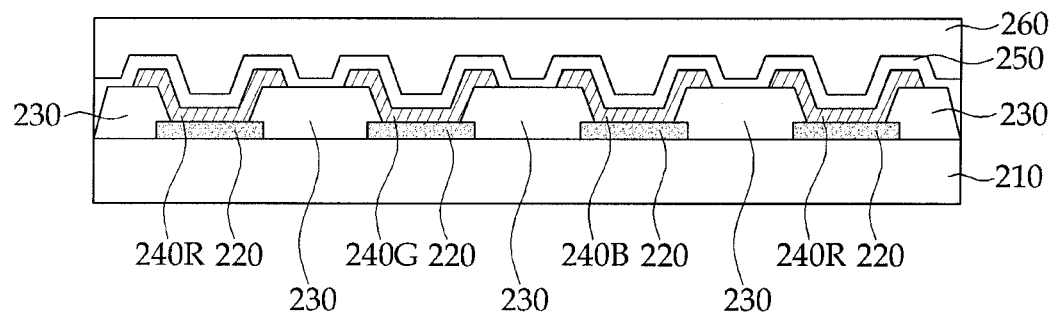
Figure 5F:
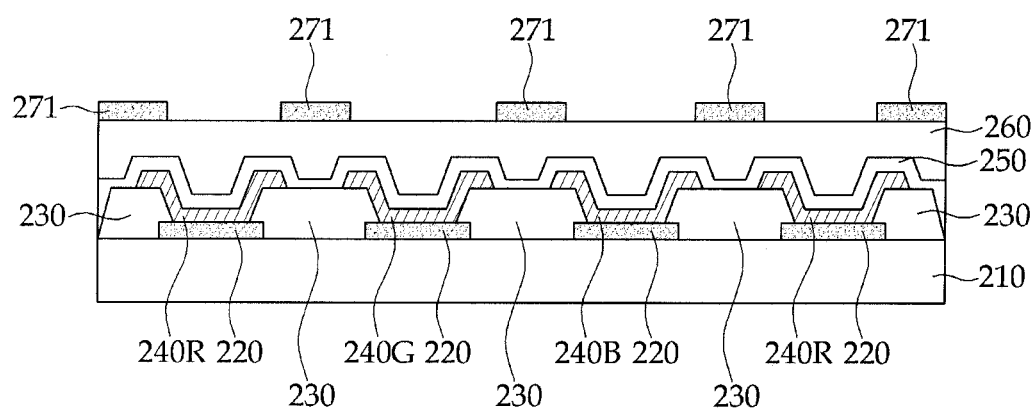
Figure 5G:
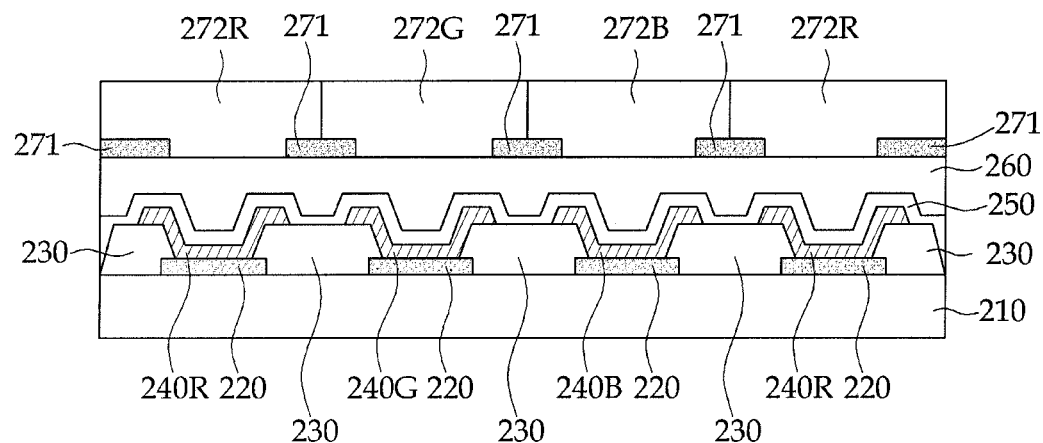
Figure 5H:
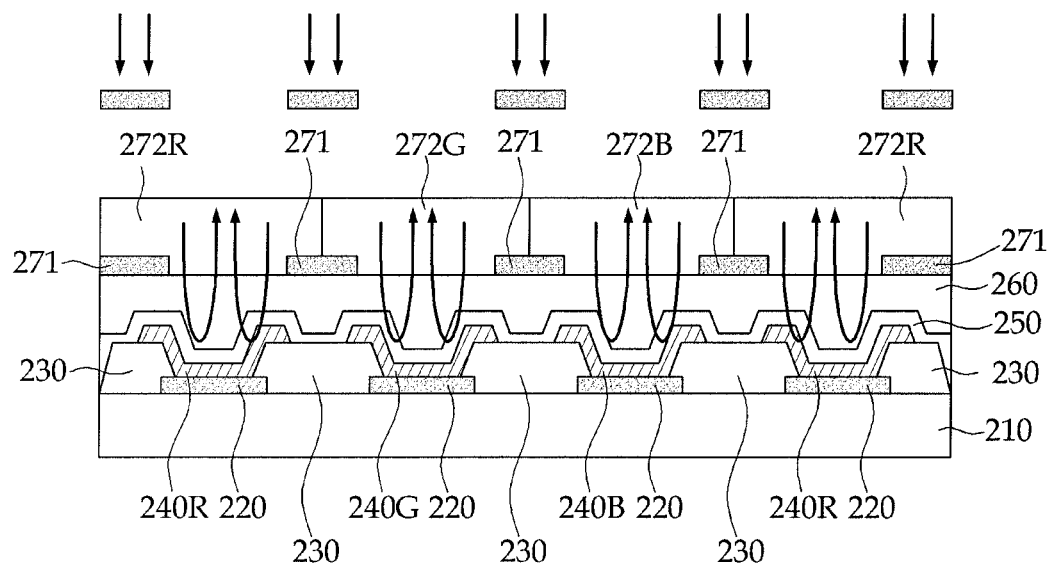
Figure 5I:
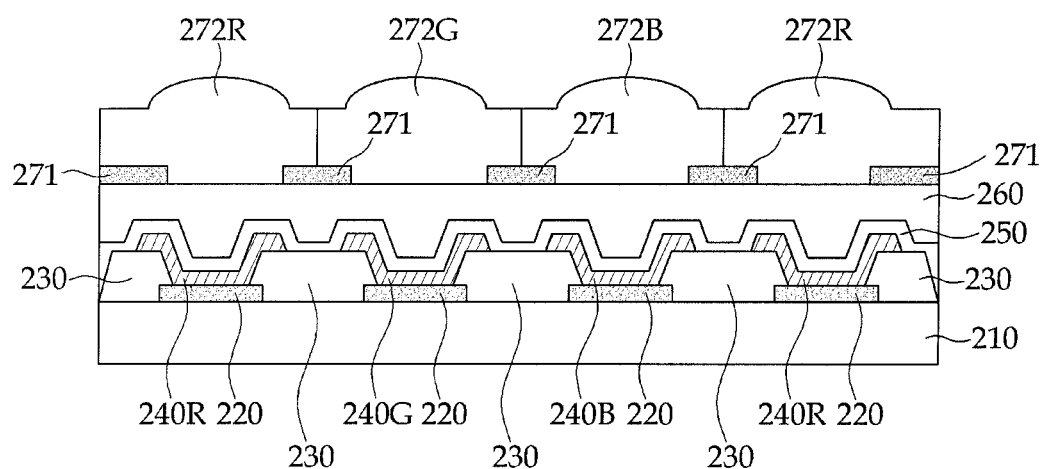

Here, processes after FIG. 5F, that is, forming a plurality of first electrodes 320 on the substrate 310, forming a pixel defining electrode 330 between the plurality of first electrodes 320, forming light emitting layers 340R, 340G, and 340B on the first electrode 320, forming a second electrode 350 on the light emitting layer 340, forming a protective layer 360 on the second electrode 350, and forming a black matrix pattern 371 on the protective layer 360 are illustrated.

FIG. 10A illustrates coating color filters 372R, 372G, and 372B on or over the protective layer 360 where the black matrix 371 is patterned, and FIGS. 10B and 10C illustrate forming a concave lens-shaped embossed portion by exposing and then developing the color filters 372R, 372G, and 372B by using a mask.

Further, an organic layer 373 may be further formed on the color filters 372R, 372G, and 372B, and in this case, the manufactured organic light emitting display device is the same as the organic light emitting display device illustrated in FIG. 9.

From the foregoing, it will be appreciated that various embodiments have been described herein for purposes of illustration, and that various modifications may be made without departing from the scope and spirit of the present invention. Accordingly, the various embodiments disclosed herein are not intended to be limiting, with the true scope and spirit being indicated by the following claims.

What is claimed is:

1. An organic light emitting display device, comprising:
    a substrate;
    a pixel array of a plurality of pixels formed over the substrate; and
    a filter formed over the pixel array, wherein the filter comprises:
        a black matrix layer defining a plurality of openings, and
        a plurality of color filters formed in the plurality of openings, wherein each color filter comprises a non-flat surface facing away from the pixel array.

2. The organic light emitting display device of claim 1, wherein the non-flat surface comprises at least one convexed structure bulged away from the substrate.

3. The organic light emitting display device of claim 1, wherein the plurality of pixels comprise a red pixel, a green pixel, and a blue pixel, and wherein the plurality of color filters comprises a red filter, a green filter, and a blue filter which correspond to the red pixel, the green pixel and the blue pixel, respectively.

4. The organic light emitting display device of claim 1, wherein each of the plurality of pixels comprises a white light emitting material, and wherein the plurality of color filters comprises a red filter, a green filter and a blue filter, each of which is disposed over the white light emitting material of the pixels.

5. The organic light emitting display device of claim 1, wherein the black matrix does not overlap with the pixels in a thickness direction of the organic light emitting display device.

6. The organic light emitting display device of claim 1, wherein the black matrix is configured to absorb at least part of visible light.

7. The organic light emitting display device of claim 1, wherein the embossed portion has a concave lens shape.

8. The organic light emitting display device of claim 1, wherein the plurality of pixels are separated from one another by the black matrix layer when viewed in a thickness direction of the device.

9. The organic light emitting display device of claim 8, wherein at least one of the plurality of color filters is formed over each of the plurality of pixels.

10. The organic light emitting display device of claim 8, wherein each of the plurality of color filters formed over the plurality of pixels comprises at least two discrete non-flat structures.

11. The organic light emitting display device of claim 1, wherein the organic layer has a refractive index ranging from about 1.2 to about 1.5.

12. The organic light emitting display device of claim 7, wherein a refractive index of the organic layer is from about 1.5 to about 1.8.

13. The organic light emitting display device of claim 1, wherein an angle between the non-flat surface and a surface parallel to the substrate is in the range about of 15 degrees to about 70 degrees.

14. The organic light emitting display device of claim 1, further comprising a plurality of thin film transistors formed over the substrate, and an insulation layer formed over the plurality of thin film transistors.

15. The organic light emitting display device of claim 1, further comprising a protective layer formed between the pixel array and the filter.

16. The organic light emitting display device of claim 1, wherein each pixel comprises a pixel electrode and a light emitting layer, wherein at least one of a hole injection layer and a hole transfer layer is disposed between the pixel electrode and the the light emitting layer.

17. The organic light emitting display device of claim 1, wherein the pixel array further comprises a common electrode, wherein at least one of an electron injection layer and an electron transport layer is disposed between the light emitting layer and the common electrode.

18. A method of making an organic light emitting display device, comprising:
    forming a black matrix having an opening over a thin film encapsulation;
    forming a color filter over the black matrix;
    exposing the color filter layer to light;
    developing the color filter layer; and
    forming an organic layer over the color filter layer and flattening the organic layer to produce the organic light emitting display device of claim 1.

19. The method of claim 18, wherein a mask is used during exposing.

* * * * *